(12) United States Patent
Inoue

(10) Patent No.: US 7,910,271 B2
(45) Date of Patent: Mar. 22, 2011

(54) FUNCTIONAL SUBSTRATE

(75) Inventor: Satoshi Inoue, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 1012 days.

(21) Appl. No.: 11/577,304

(22) PCT Filed: Oct. 7, 2005

(86) PCT No.: PCT/JP2005/018621
§ 371 (c)(1),
(2), (4) Date: Apr. 13, 2007

(87) PCT Pub. No.: WO2006/041027
PCT Pub. Date: Apr. 20, 2006

(65) Prior Publication Data
US 2008/0063949 A1 Mar. 13, 2008

(30) Foreign Application Priority Data

Oct. 13, 2004 (JP) .................. 2004-299264

(51) Int. Cl.
*H05B 33/00* (2006.01)
*G02B 5/20* (2006.01)
*H01L 33/00* (2010.01)

(52) U.S. Cl. ........... 430/7; 430/319; 430/321; 430/394; 313/504

(58) Field of Classification Search .............. None
See application file for complete search history.

(56) References Cited

U.S. PATENT DOCUMENTS

| 2003/0085943 A1 | 5/2003 | Nakamura et al. |
| 2004/0113550 A1 | 6/2004 | Adachi et al. |
| 2004/0135501 A1 | 7/2004 | Nishikawa |
| 2005/0112341 A1* | 5/2005 | Ito et al. .................. 428/209 |
| 2005/0116632 A1 | 6/2005 | Funamoto et al. |
| 2005/0134172 A1 | 6/2005 | Yoshikawa |

FOREIGN PATENT DOCUMENTS

| JP | 06-347637 A | 12/1994 |
| JP | 2000-353594 A | 12/2000 |
| JP | 2003-057673 A | 2/2003 |
| JP | 2003-127392 A | 5/2003 |
| JP | 2004-079397 A | 3/2004 |
| JP | 2004-157151 A | 6/2004 |
| JP | 2004-165067 A | 6/2004 |

(Continued)

OTHER PUBLICATIONS

Official Communication for PCT Application No. PCT/JP2005/018621; mailed Jan. 24, 2006.

(Continued)

*Primary Examiner* — John A. McPherson
(74) *Attorney, Agent, or Firm* — Keating & Bennett, LLP

(57) ABSTRACT

An organic EL device includes a substrate body, a plurality of organic functional layers arranged on the substrate body in a given pattern and a partition for partitioning the plural organic functional layers. The partition includes at least a first partition part with a substantially trapezoidal cross-section provided on the substrate body and a second partition part with a substantially trapezoidal cross-section provided on the first partition part. The partition is formed so that a lower base of the cross-section of the second partition part can be shorter than an upper base of the cross-section of the first partition part.

19 Claims, 6 Drawing Sheets

FOREIGN PATENT DOCUMENTS

| | | |
|---|---|---|
| JP | 2004-192977 A | 7/2004 |
| JP | 2004-209409 A | 7/2004 |
| JP | 2004-319119 A | 11/2004 |
| JP | 2005-322564 A | 11/2005 |
| JP | 2005-326799 A | 11/2005 |

OTHER PUBLICATIONS

English translation of the Official communication issued in the counterpart International Application No. PCT/JP2005/018621, mailed on Jan. 24, 2006.

* cited by examiner

FUNCTIONAL SUBSTRATE

BACKGROUND OF THE INVENTION

1. Field of the Invention

The present invention relates to a functional substrate represented by an organic EL device, a color filter substrate or the like.

2. Description of the Related Art

An example of the functional substrate is an organic electroluminescent device (hereinafter sometimes referred to as the "organic EL device"). In general, the organic EL device contains an active matrix substrate on which a plurality of pixel electrodes are disposed in the form of a matrix, a partition (bank) for partitioning the plural pixel electrodes, an organic functional layer including an organic electroluminescent luminous layer (hereinafter sometimes referred to as the "organic EL luminous layer") formed on each of the plural pixel electrodes, and an upper common electrode covering the whole of the organic functional layers and the partition. In the organic EL device, each organic EL luminous layer forms a pixel.

Organic EL devices are roughly classified in accordance with the kind of organic functional layer. Specifically, they are roughly classified into an oligomeric organic EL (OLED) device including an oligomeric organic material as a principal component and a polymeric organic EL (PLED) device including a polymeric organic material as a principal component. In the polymeric organic EL device, the organic functional layer is generally formed by a wet type application method such as an ink-jet method (see, for example, Japanese Laid-Open Patent Publication No. 2000-353594 (Patent Document 1)).

FIG. 6 is a schematic cross-sectional view for explaining a procedure for forming an organic functional layer 120 by the ink-jet method, that is, a kind of the wet type application method.

In general, the organic functional layer 120 is formed as follows: The organic functional layer 120 is formed by dropping, onto an active matrix substrate 110 having a partition 130 thereon, ink droplets including a material for forming the organic functional layer 120 (such as a luminous material) and by thermally drying the resultant.

The drying of the ink droplets is started from a portion in the vicinity of an inclined face (slope) 131 of the partition 130. As shown in FIG. 6, immediately after dropping an ink droplet, the ink droplet is in a shape S5 largely swollen. In accordance with the proceeding of the drying, the shape of the ink droplet is gradually changed from the shape S5 to a shape S6 and from the shape S6 to a shape S7.

In the state of the shape S5 attained immediately after dropping or in the state of the shape S6 obtained when the droplet is slightly dried, a solvent included in the ink droplet is not much dried yet, and hence, the viscosity of the ink droplet is comparatively low. Therefore, at the stage where the ink droplet is dried into the shape S6, an organic material included in the ink droplet is minimally adhered onto the inclined face 131. When the ink droplet is in the shape S7 where the drying is further proceeded, the organic material included in the ink droplet starts to adhere onto the inclined face 131 of the partition 130. This is because the solvent included in the ink droplet is further dried and hence the viscosity of the ink droplet (particularly, a portion thereof disposed in the vicinity of a contact surface with the inclined face of the partition 130) is increased. When the ink droplet is further dried, the viscosity of the ink droplet is gradually increased, and the amount of organic material included in the ink droplet adhering onto the inclined face 131 of the partition is increased. Accordingly, as shown in FIG. 6, an organic functional layer 120 is formed in a concave shape having a larger thickness in a portion thereof close to the partition 130 than a center portion thereof (corresponding to a pixel portion). This phenomenon is generally designated as "pinning".

When the pinning occurs, the brightness is higher in the center portion of the organic functional layer 120 (namely, a pixel center portion) than in a peripheral portion of the organic functional layer 120 (namely, a pixel peripheral portion), and hence, a brightness spot is caused in each pixel. Accordingly, it is disadvantageously difficult to attain desired display quality.

Also, in the organic functional layer 120, a larger current passes through the center portion having a smaller thickness than through the peripheral portion having a larger thickness. In other words, most of currents passing through the organic functional layer 120 collectively pass through the center portion of the organic functional layer 120. Therefore, the degradation speed of the center portion of the organic functional layer 120 is higher than the degradation speed of the peripheral portion. Accordingly, when the pinning occurs, the life time of the organic EL device is disadvantageously shortened.

Owing to the characteristics of the ink-jet method, it is difficult to increase the concentration of the ink droplet to be dropped beyond a given concentration. Therefore, in order to form an organic functional layer 120 having a large thickness in the center portion, it is necessary to drop an ink droplet with a large volume. In the case where the ink droplet to be dropped has a large volume, it is necessary to provide the partition 130 with a sufficiently large height so that the dropped ink droplet cannot move onto an adjacent pixel electrode beyond the partition. When the partition 130 has a large height, however, the area of the inclined face 131 where the pinning of ink droplets occurs is increased, and hence, the amount of organic material adhering onto the inclined face 131 is increased. Therefore, a difference in the thickness between the center portion and the peripheral portion of the organic functional layer 120 is further increased, and it is impossible to obtain a desired thickness in the center portion of the organic functional layer 120. Therefore, sufficiently high luminous brightness cannot be attained, and hence, there arises a problem that desired image display quality cannot be attained.

SUMMARY OF THE INVENTION

The present invention was devised in consideration of the aforementioned conventional disadvantages, and an object of the invention is providing a functional substrate such as an organic EL device including a functional layer having a uniform thickness (free from thickness variation).

The functional substrate of this invention includes a substrate body; a plurality of functional layers arranged on the substrate body in a given pattern; and a partition for partitioning the plurality of functional layers. The partition includes at least a first partition part with a substantially trapezoidal cross-section provided on the substrate body and a second partition part with a substantially trapezoidal cross-section provided on the first partition part, and a lower base of the cross-section of the second partition part is shorter than an upper base of the cross-section of the first partition part.

The partition may include an organic material. For example, it may include one resin or two or more resins selected from the group consisting of a polyimide resin, an acrylic resin and a Novolac resin.

The partition preferably has a liquid-repellent property at least on an inclined face thereof and a top face thereof. The partition may include a material having a liquid-repellent property, so as to attain a liquid-repellent property on its surface.

Also, the partition is preferably formed in a height larger than 1 μm and in such a manner that a height of the first partition part is smaller than 1.5 μm.

Each of the plurality of functional layers preferably includes a polymeric organic material. Also, each of the plurality of functional layers may be formed by a wet type application method. It is noted that the "wet type application method" herein means a method for forming a thin film by using an ink in which a thin film material is dissolved in a solvent (such as water or an organic solvent). Specific examples are the ink-jet method, a printing method and spin coating. It is noted that a "contact angle" herein means a value measured by using CA-W (automatic contact angle meter) manufactured by Kyowa Interface Science Co., Ltd.

Each of the plurality of functional layers may be a color filter layer, an organic electroluminescent luminous layer, a conducting layer, an organic semiconductor layer, a lens layer or the like. In other words, the functional substrate of this invention may be a color filter substrate, an organic electroluminescence device, a circuit substrate, an organic semiconductor substrate (such as an organic thin film transistor substrate), a microlens array substrate or the like.

The display panel of this invention includes a functional substrate. The functional substrate includes a substrate body, a plurality of display medium layers arranged on the substrate body in a given pattern and a partition for partitioning the plurality of display medium layers. The partition includes at least a first partition part with a substantially trapezoidal cross-section provided on the substrate body and a second partition part with a substantially trapezoidal cross-section provided on the first partition part, and a lower base of the cross-section of the second partition part is shorter than an upper base of the cross-section of the first partition part.

The display device of this invention includes a functional substrate. The functional substrate including a substrate body, a plurality of display medium layers arranged on the substrate body in a given pattern and a partition for partitioning the plurality of display medium layers. The partition includes at least a first partition part with a substantially trapezoidal cross-section provided on the substrate body and a second partition part with a substantially trapezoidal cross-section provided on the first partition part, and a lower base of the cross-section of the second partition part is shorter than an upper base of the cross-section of the first partition part.

In the display panel and the display device of this invention, the "display medium layer" means a layer for modulating light transmittance or light reflectance by using a potential difference between electrodes opposing each other or a layer for spontaneously emitting light by using a current flowing between electrodes opposing each other. Specific examples of the display medium layer are a liquid crystal layer, an inorganic or organic electroluminescent layer, a light emitting gas layer, an electrophoretic layer and an electrochromic layer.

The fabrication method of this invention is a method for fabricating the functional substrate of this invention and includes the steps of forming a film on the substrate body; and forming the partition by subjecting the film to half exposure.

DETAILED DESCRIPTION OF PREFERRED EMBODIMENTS

Now, a preferred embodiment of the invention will be described in detail with reference to the accompanying drawings.

Figure 1:
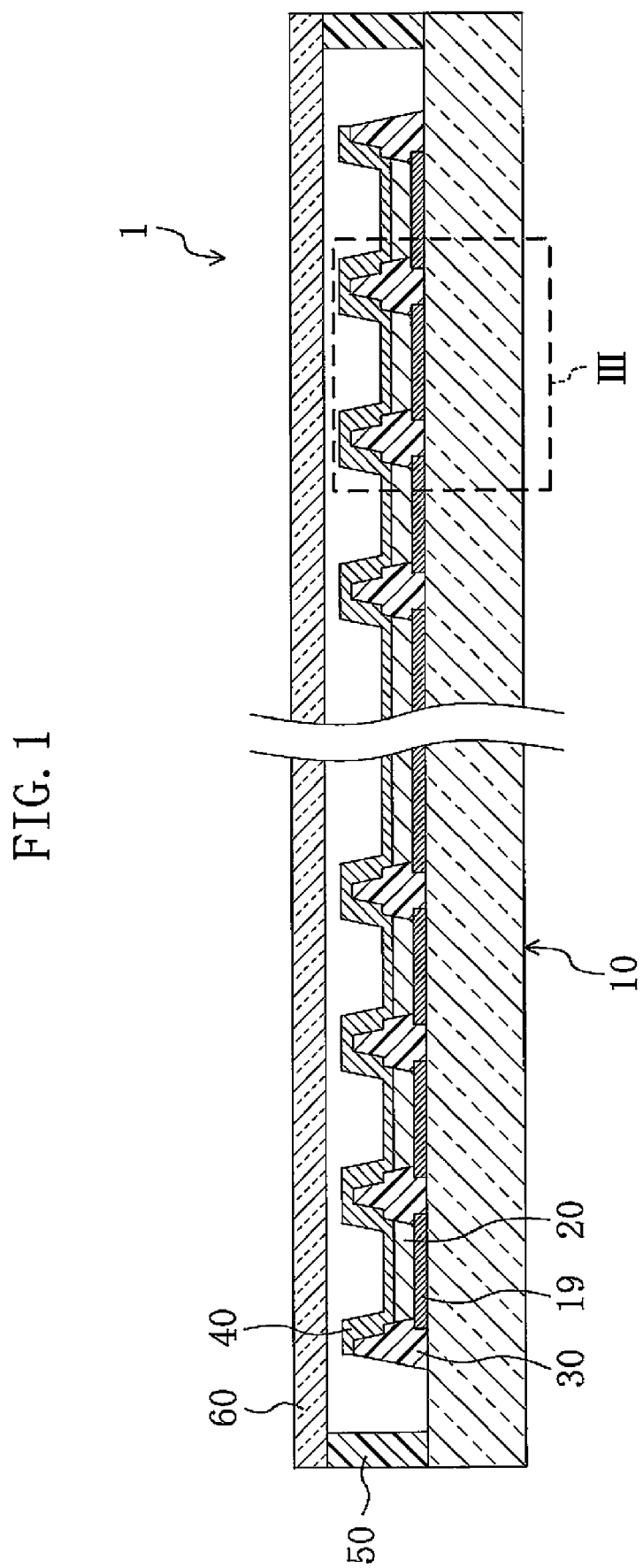
FIG. 1 is a schematic cross-sectional view of an organic EL device 1 (organic EL device) according to an embodiment.
Figure 2:
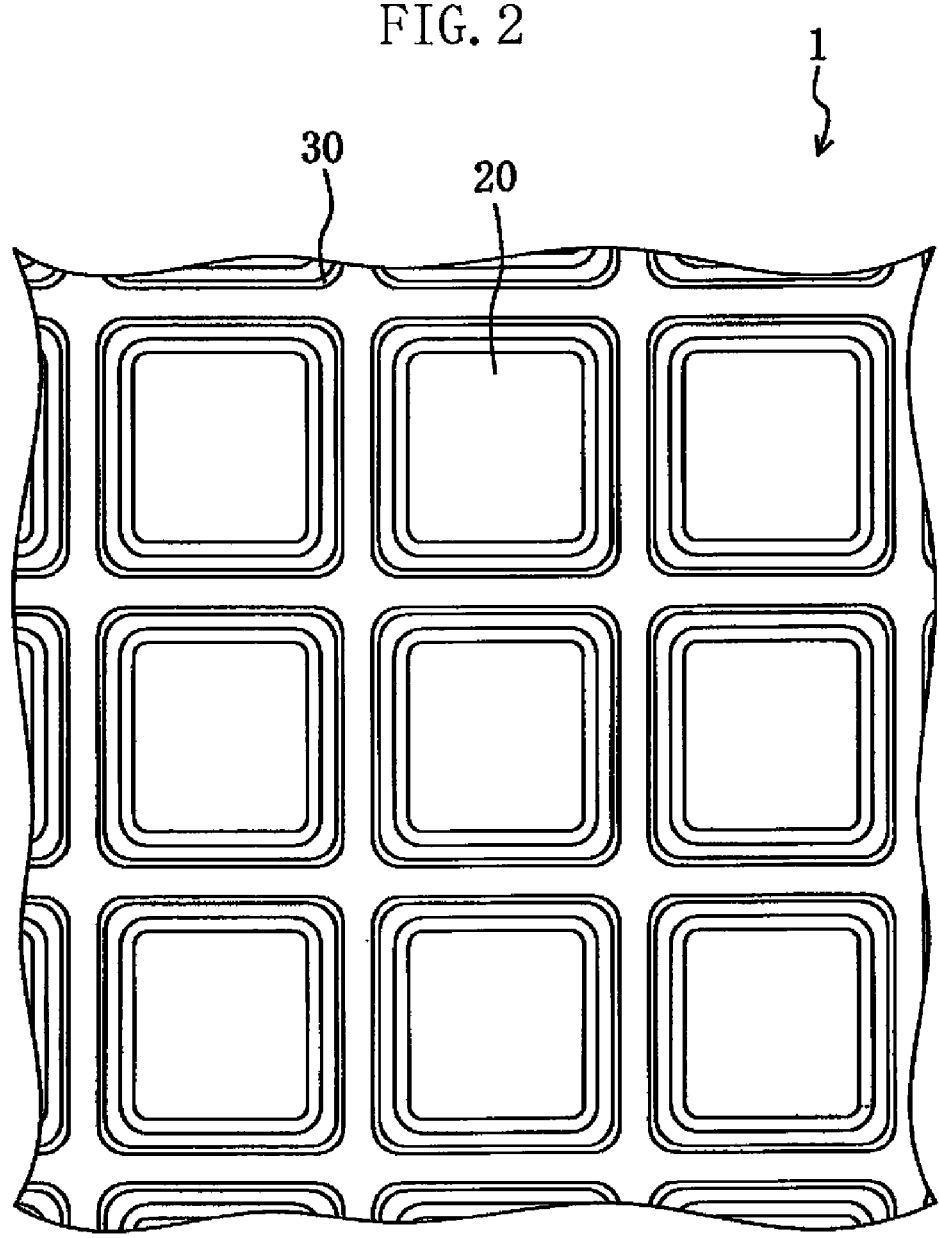
FIG. 2 is a front view of the organic EL device 1 taken from a side of a sealing substrate 60.
Figure 3:
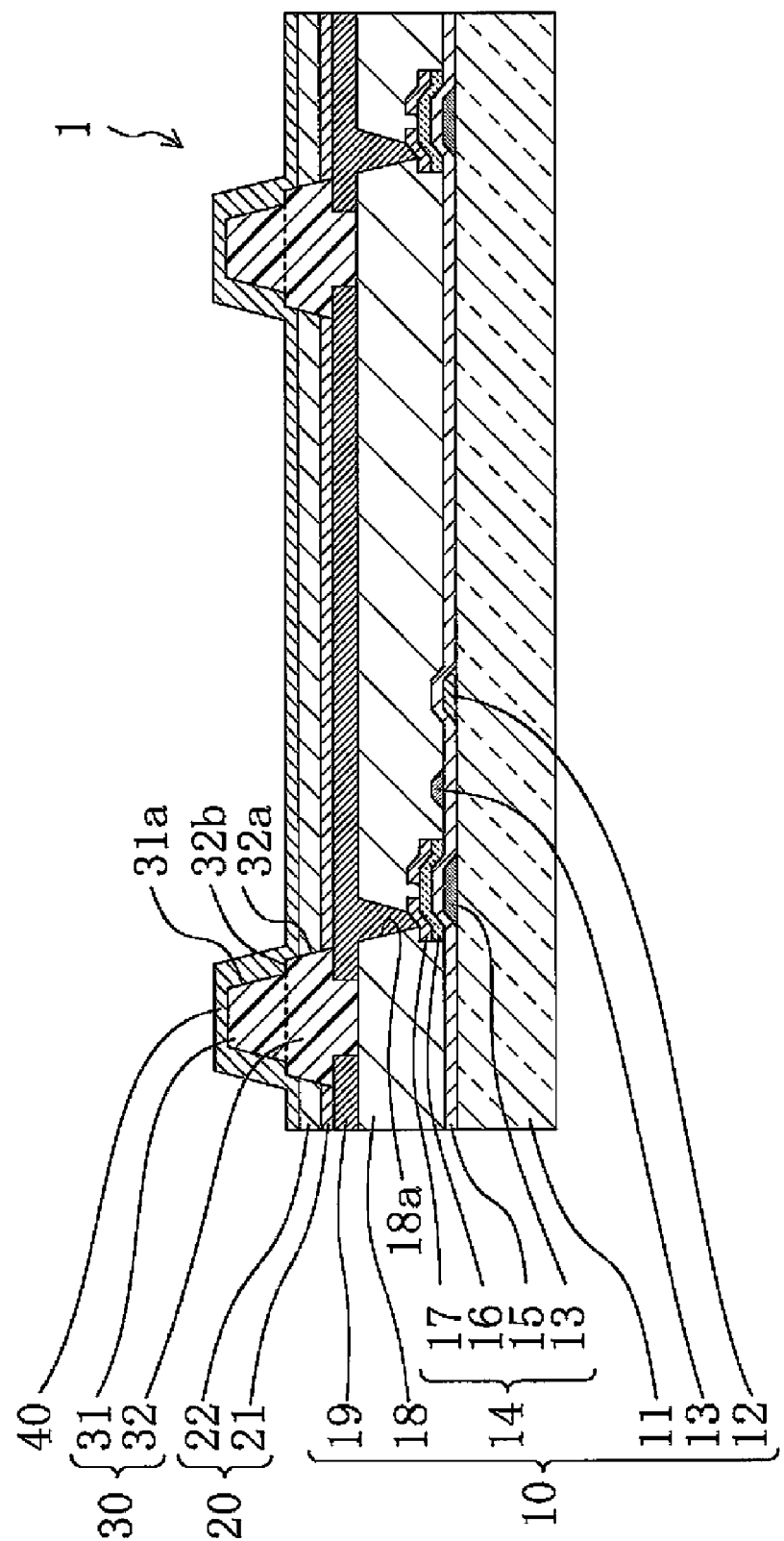
FIG. 3 is a detailed cross-sectional view of a portion surrounded with a broken line III of FIG. 1.

FIG. 1 is a schematic cross-sectional view of an organic EL device 1 (organic EL device) according to the embodiment. FIG. 2 is a front view of the organic EL device 1 taken from a side of a sealing substrate 60. FIG. 3 is a detailed cross-sectional view of a portion surrounded with a broken line III of FIG. 1. It is noted that the sealing substrate 60 and an upper common electrode 40 are not shown in FIG. 2 for convenience. Also, the upper common electrode 40 is not shown in FIG. 3.

The organic EL device 1 includes an active matrix substrate (substrate body) 10 on which a plurality of pixel electrodes 19 are arranged in the form of a matrix, a plurality of organic functional layers 20, a partition (bank) 30, the upper common electrode 40, the sealing substrate 60 and a seal 50. Each of the plural organic functional layers 20 arranged in the form of a matrix forms a pixel. As shown in FIG. 3, the active matrix substrate 10 includes a substrate body 11, a plurality of source lines 12, a plurality of gate lines 13, a plurality of TFTs 14, a plurality of pixel electrodes 19 and a planarizing film 18.

The substrate body 11 has a function to secure the mechanical durability of the organic EL device 1 and a function to suppress invasion of moisture and oxygen from the outside into the organic functional layers 20 and the like. The substrate body 11 may be a glass substrate, a quartz substrate, an insulating inorganic substrate such as a ceramic substrate (like an alumina ceramic substrate or the like), or a plastic substrate (such as a polyethylene terephthalate substrate). Alternatively, it may be a substrate obtained by coating one face of a metal substrate of aluminum, iron or the like with an insulating material such as $SiO_2$ (silica gel) or an organic insulating material, or a substrate obtained by subjecting a surface of a metal substrate of aluminum, iron or the like to insulating processing by anodic oxidization or the like. In the case where the organic EL device 1 employs what is called a bottom emission method in which light is emitted from the side of the substrate body 11, the substrate body 11 is preferably made of a material with high light transmittance such as glass or plastic.

The plural source lines (data signal lines) 12 are formed so as to extend in parallel. Each source line 12 is electrically connected to a corresponding one of the TFTs 14 so as to input a data signal to the TFT 14. The plural gate lines (scanning signal lines) 13 are formed so as to extend in parallel and at an angle against the extending direction of the source lines 12. Each gate line 13 is electrically connected to a corresponding one of the TFTs 14 so as to input a scanning signal to the TFT 14. Each TFT 14 supplies a current to a corresponding one of the pixel electrodes 19 on the basis of the data signal and the scanning signal input from the source line 12 and the gate line 13. The source lines 12 and the gate lines 13 may be made of a conducting material (for example, a conducting metal) such as aluminum (Al), tantalum (Ta) or tungsten (W).

Each TFT 14 includes the gate line (gate metal) 13, an island-shaped semiconductor 16 formed on the gate line 13, a gate insulating film 15, and a drain electrode 17 provided on the island-shaped semiconductor 16. The gate insulating film 15 has a function to insulate the gate line 13 and the island-shaped semiconductor 16 from each other for securing the voltage resistance of the TFT 14. The gate insulating film 15 may be made of a silicon film, a silicon nitride film, a tantalum oxide film or the like. Alternatively, it may be made of a multilayered film of a silicon oxide film/a silicon nitride film/a silicon oxide film. The island-shaped semiconductor 16 may be made of polysilicon (Si) or the like. The drain electrode 17 is made of aluminum or the like and is electrically connected to the pixel electrode 19.

The TFT 14 has a bottom gate structure in this embodiment, which does not limit the invention, and it may have, for example, a top gate structure. Also, each TFT 14 may be replaced with another switching device such as an MIM (metal-insulator-metal) diode.

The planarizing film 18 has a function to planarize one face (that is, the upper face in FIG. 3) of the active matrix substrate 10. Since the planarizing film 18 is provided, the pixel electrodes 19, the organic functional layers 20 and the like formed on and above the planarizing film 18 can be formed evenly. The planarizing film 18 may be made of a resin material such as an acrylic resin, a Novolac resin or a polyimide resin.

The plural pixel electrodes 19 are arranged on the planarizing film 18 in given arrangement (for example, in a matrix). The pixel electrodes 19 may be made of a metal material, an alloy, a conducting oxide or the like. Examples of the metal material are silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb) and lithium fluoride (LiF). Examples of the alloy are magnesium (Mg)/copper (Cu), magnesium (Mg)/silver (Ag), sodium (Na)/potassium (K), astatine (At)/astatine oxide (AtO2), lithium (Li)/aluminum (Al), lithium (Li)/calcium (Ca)/aluminum (Al), and lithium fluoride (LiF)/calcium (Ca)/aluminum (Al). Examples of the conducting oxide are tin oxide (SnO), zinc oxide (ZnO), indium tin oxide (ITO), and indium zinc oxide (IZO). For realizing high efficiency for injecting holes from the pixel electrode 19 to the organic functional layer 20, a material with a large work function such as indium tin oxide (ITO) or indium zinc oxide (IZO) is more preferably used among the aforementioned materials.

Furthermore, for realizing high efficiency for taking light out of an organic EL luminous layer 22, in the case where the organic EL device 1 employs the so-called bottom emission method in which the light of the organic EL luminous layer 22 is taken out from the side of the substrate body 11, the pixel electrodes 19 are preferably made of a material with a light transmission property such as indium tin oxide (ITO). On the other hand, in the case where the organic EL device 1 employs what is called a top emission method in which the light of the organic EL luminous layer 22 is taken out from a side of the upper common electrode 40, the pixel electrodes 19 are preferably made of a material with a light reflection property such as aluminum (Al).

The pixel electrode 19 has a thickness preferably not less than 50 nm and not more than 500 nm. When the thickness is smaller than 50 nm, desired film strength cannot be attained, and a desired resistance value cannot be attained. When the thickness is larger than 500 nm, it is apprehended that the pixel electrode 19 is peeled off.

The pixel electrode 19 may be subjected to a lyophilic treatment. When the lyophilic treatment is performed, the affinity between the pixel electrode 19 and the organic functional layer 20 is improved, and hence, the organic functional layer 20 can be formed in a more uniform thickness. An example of the lyophilic treatment is a UV/O3 treatment (ozone/ultraviolet light treatment). It is noted that the "lyophilic treatment" herein means a treatment for providing a lyophilic property. Also, a "lyophilic property" means a property for attaining a contact angle of 20 degrees or less between the pixel electrode 19 and an ink droplet used for forming the organic functional layer by the wet type application method.

Although each pixel electrode 19 is formed in a substantially rectangular shape in this embodiment, the pixel electrode 19 may be formed in a circular shape, an elliptical shape or the like.

The organic functional layer 20 provided on each pixel electrode 19 includes a hole carrying layer 21 formed on the pixel electrode 19 and the organic EL luminous layer 22 formed on the hole carrying layer 21. It is noted that the structure of the organic functional layer 20 is not limited to this in this invention. The organic functional layer 20 may include the organic EL luminous layer 22 alone. Alternatively, it may include the organic EL luminous layer 22 and one layer or two or more layers selected from a hole injecting layer, the hole carrying layer 21, an electron injecting layer and an electron carrying layer.

The hole carrying layer 21 has a function to improve the efficiency for carrying holes from the pixel electrode 19 to the organic EL luminous layer 22. Examples of a hole carrying material used for forming the hole carrying layer 21 are a porphyrin derivative, an aromatic tertiary amine compound, a styryl amine derivative, polyvinyl carbazole, poly-p-phenylenevinylene, polysilane, a triazole derivative, an oxadiazole derivative, an imidazole derivative, a polyaryl alkane derivative, a pyrazoline derivative, a pyrazolone derivative, a phenylenediamine derivative, an arylamine derivative, an amine-substituted chalcone derivative, an oxazole derivative, a styryl anthracene derivative, a fluorenone derivative, a hydrazone derivative, a stilbene derivative, amorphous silicon hydride, hydrogenated amorphous silicon carbide, zinc sulfide and zinc selenide.

The organic EL luminous layer 22 has a function to emit light by recombining holes injected from the pixel electrode 19 and electrons injected from the upper common electrode 40. Examples of a luminous material used for forming the organic EL luminous layer 22 are a metal oxinoide compound [a 8-hydroxyquinoline metal complex], a naphthalene derivative, an anthracene derivative, a diphenylethylene derivative, a vinylacetone derivative, a triphenylamine derivative, a butadiene derivative, a cumarin derivative, a benzoxazole derivative, an oxadiazole derivative, an oxazole derivative, a benzimidazole derivative, a thiadiazole derivative, a benzthiazole derivative, a styryl derivative, a styryl amine derivative, a bis-styryl benzene derivative, a tris-styryl benzene derivative, a perylene derivative, a perynone derivative, an aminopyrene derivative, a pyridine derivative, a rhodamine derivative, an aquidine derivative, phenoxazone, a quinacridone derivative, rubrene, poly-p-phenylenevinylene and polysilane.

As shown in FIG. 2, the partition 30 are formed in the shape of a lattice in a plan view, so as to partition the plural pixel electrodes 19 and the plural organic functional layers 20 provided on the active matrix substrate 10 in the form of a matrix. Each opening of the partition 30 (corresponding to a portion where each pixel electrode 19 is exposed) is formed in a substantially rectangular shape. It is noted that a substantially rectangular shape herein means a rectangular shape or a rectangular shape having obtuse corners. Herein, an obtuse corner means a corner constructed from an angle (or a plurality of angles) exceeding 90 degrees or a curve. The corner may be constructed from a combination of a curve and an obtuse angle.

The partition 30 includes a first partition part 32 provided on the active matrix substrate 10 and a second partition part provided on the first partition part 32. Each of the first partition part 32 and the second partition part has a cross-section in a substantially trapezoidal shape (hereinafter, the "substantially trapezoidal shape of the cross-section of the first partition part 32" is designated as a "substantial trapezoid a" and the "substantially trapezoidal shape of the cross-section of the second partition part" is designated as a "substantial trapezoid b").

The upper base of the substantial trapezoid a is longer than the lower base of the substantial trapezoid b, so that a part of a top face 32b of the first partition part 32 can be exposed. In other words, the first partition part 32 and the second partition part 31 are formed so as to form a step.

The height of the partition 30 is preferably larger than 1 μm, and more preferably 1.5 μm or more. The height of the first partition part 32 is preferably smaller than 1.5 μm, and more preferably 1 μm or less.

At least the surface of the partition 30 preferably has a liquid-repellent property. As a method for fabricating the partition 30 having a surface with a liquid-repellent property, for example, the partition 30 is made of a material having a liquid-repellent property, or the partition 30 is subjected to a liquid-repellent treatment. It is noted that the liquid-repellent treatment means a treatment for providing a liquid-repellent property. A state in which a contact angle between the partition 30 and an ink droplet used for forming the organic functional layer 20 by the wet type application method is 40 degrees or more is designated as the "liquid-repellent property".

The partition 30 can be made of an organic material. Among organic materials, it is preferably made of, for example, a polyimide resin, an acrylic resin, a Novolac resin or a mixed resin of any of these resins. A polyimide resin, an acrylic resin and a Novolac resin are good at the heat resistance (thermal stability) among the organic materials and minimally suffer from degas, change in color, deterioration, change in shape and the like. Accordingly, when the partition 30 includes one resin or two or more resins selected from the group consisting of a polyimide resin, an acrylic resin and a Novolac resin, the stability of the partition 30 can be improved, so that the organic EL device 1 can attain a long product life time.

The upper common electrode 40 has a function to inject electrons into the organic functional layer 20. The upper common electrode 40 can be made of a metal material such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb) or lithium fluoride (LiF). Alternatively, the upper common electrode may be made of an alloy such as magnesium (Mg)/copper (Cu), magnesium (Mg)/silver (Ag), sodium (Na)/potassium (K), astatine (At)/astatine oxide (AtO2), lithium (Li)/aluminum (Al), lithium (Li)/calcium (Ca)/aluminum (Al), or lithium fluoride (LiF)/calcium (Ca)/aluminum (Al), or a conducting oxide such as tin oxide (SnO), zinc oxide (ZnO), indium tin oxide (ITO), or indium zinc oxide (IZO). Alternatively, the upper common electrode 40 may be formed by stacking a plurality of layers of any of these materials.

For realizing high efficiency for injecting electrons into the organic functional layer 20, a material with a small work function is preferably used among these materials. Examples of the material with a small work function are magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al) and lithium fluoride (LiF)/calcium (Ca)/aluminum (Al).

For realizing high efficiency for taking light out of the organic EL luminous layer 22, in the case where the organic EL device 1 employs the so-called top emission method in which the light of the organic EL luminous layer 22 is taken out from the side of the upper common electrode 40, the upper common electrode 40 is preferably made of a material with a light transmission property such as indium tin oxide (ITO). On the other hand, in the case where the organic EL device 1 employs the so-called bottom emission method in which the light of the organic EL luminous layer 22 is taken out from the side of the substrate body 11, the upper common electrode 40 is preferably made of a material with a light reflection property such as aluminum (Al).

The sealing substrate 60 has a function to prevent the invasion of oxygen and moisture into the organic functional layers 20 and the like. The sealing substrate 60 can be made of a glass substrate or a quartz substrate. The sealing substrate 60 is adhesively fixed with the seal 50. The material for the seal 50 is preferably a material with low oxygen permeability and low moisture permeability such as an epoxy resin.

Now, fabrication procedures for the organic EL device 1 will be described in detail.

First, the pixel electrodes 19 arranged in the form of a matrix on the active matrix substrate 10 are subjected to a lyophilic treatment such as a UV/O3 treatment (ozone/ultraviolet light treatment). When the pixel electrodes 19 are thus provided with a lyophilic property, affinity and adhesiveness between the hole carrying layer 21 and the pixel electrodes 19 can be improved. Also, the hole carrying layer 21 can be formed in a uniform thickness.

Next, a resin film of polyimide or the like is formed on the active matrix substrate 10 by spin coating or the like. The resin film is etched into a desired shape through half exposure, so as to form the partition 30. The "half exposure" means a process in which an underlying part of an exposed portion of a photosensitive resin film (that is, a face other than an exposed face of the photosensitive resin film) remains to some extent when development is completed. In other words, it means a process in which exposure is performed so as not to expose a layer disposed beneath the photosensitive resin layer. Specifically, a portion of the resin film of polyimide or the like corresponding to the second partition part 31 alone is masked with a photomask or the like, and the exposure is performed under this condition with light exposure for allowing a given thickness of the photosensitive resin to remain through the development, so as to form the second partition part 31. Subsequently, a whole region where the partition 30 is to be formed is masked with a photomask or the like, and exposure is fully performed (namely, with light exposure for completely removing the photosensitive resin through the development). After the exposure, development process is performed, so as to complete the partition 30 composed of the second partition part 31 and the first partition part 32. In this method, the first partition part 32 and the second partition part 31 can be made of the same resin film. Accordingly, as compared with the case where the first partition part 32 and the second partition part 31 are respectively made of different thin films, the number of procedures for forming a resin film and performing development can be reduced, so that the fabrication cost of the organic EL device 1 can be reduced.

Next, the partition 30 thus formed is subjected to a liquid-repellent treatment. An example of the liquid-repellent treatment is a fluorine plasma treatment such as a carbon tetrafluoride (CF4) plasma treatment. In the case where the carbon tetrafluoride (CF4) plasma treatment is performed, it is preferably performed with low output and in a short period of time so as not to damage the partition 30. The treatment time is preferably 20 seconds through 30 minutes and is appropriately determined depending upon the material for the partition 30. The output is preferably 10 through 1000 W/m2.

Instead of subjecting the partition 30 to the liquid-repellent treatment, the partition 30 may include a material (an additive) having a liquid-repellent property. Alternatively, the partition 30 may be made of a material having a liquid-repellent property. Examples of the material (additive) having the liquid-repellent property are a fluorine-based material, a silica-based material, and a polyimide resin having a methyl group or a fluorine group on a side chain. Examples of the fluorine-based material are calcium fluoride, aluminum sodium hexafluoride, sodium fluoride, sodium monofluorophosphate and fluoroethylene. Examples of the silica-based material are polysilazane and tetraethoxysilane.

When the method in which the liquid-repellent property is provided to the partition 30 by the liquid-repellent treatment is employed, the freedom in selecting the material for the partition 30 is large and the freedom in the fabrication method is large, and hence, the fabrication efficiency can be further improved. On the other hand, when the partition 30 is made of a material having the liquid-repellent property, the fabrication process can be simplified because there is no need to perform the liquid-repellent treatment, and hence, the organic EL device 1 can be easily fabricated.

Next, the hole carrying layer 21 is formed by the wet type application method such as the ink-jet method on the plural pixel electrodes 19 partitioned by the partition 30. Specifically, the hole carrying layer 21 is formed by dropping, onto each region partitioned by the partition 30, an ink in which a hole carrying material is dissolved (or dispersed) in a solvent and by drying the ink. The drying is preferably performed by using a hot plate or an oven at 150° C. through 250° C. for 0.5 through 120 minutes.

Examples of the solvent in which the hole carrying material is dissolved (or dispersed) are toluene, o-xylene, m-xylene, p-xylene, ethylbenzene, hemimellitene[1,2,3-trimethylbenzene], pseudocumene[1,2,4-trimethylbenzene], mesitylene [1,3,5-trimethylbenzene], cumene[isopropylbenzene], prehnitene[1,2,3,4-tetramethylbenzene], isodurene[1,2,3,5-tetramethylbenezene], durene[1,2,4,5-tetramethylbenzene], p-cymene [isopropyltoluene], tetralin[1,2,3,4-tetrahydronaphthalene], cyclohexylbenzene, mellitene [hexamethylbenzene], methanol, ethanol, 1-propanol, 2-propanol[IPA; isopropyl alcohol], ethylene glycol[1,2-ethanediol], diethylene glycol, 2-methoxyethanol[ethylene glycol monomethyl ether, methyl cellosolve], 2-ethoxyethanol[ethylene glycol monoethyl ether, cellosolve], 2-(methoxymethoxy)ethanol, 2-isopropoxyethanol, 2-butoxyethanol, diethylene glycol monomethyl ether, diethylene glycol monoethyl ether, diethylene glycol monobutyl ether, triethylene glycol monomethyl ether, glycerin, acetone, N-methyl-2-pyrrollidone, 1,3-dimethyl-2-imidazolidinone, anisole[methoxybenzene], water and a mixed solvent of any of these solvents.

Figure 4:
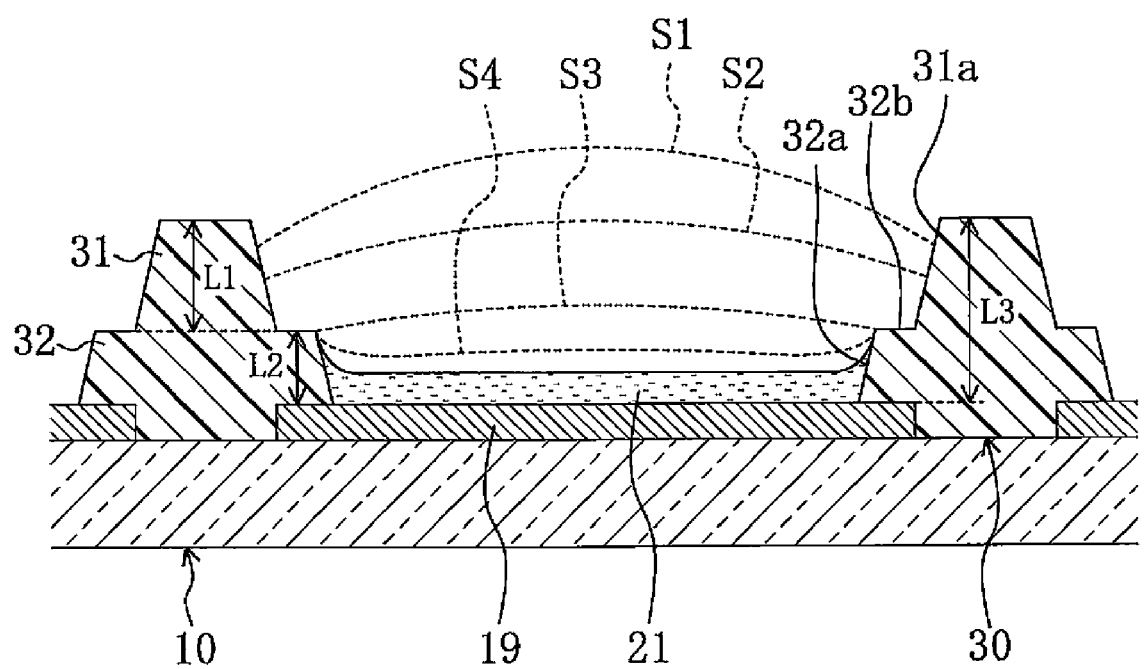
FIG. 4 is a schematic cross-sectional view for explaining a procedure for forming a hole carrying layer 21 by dropping an ink droplet.
Figure 5:
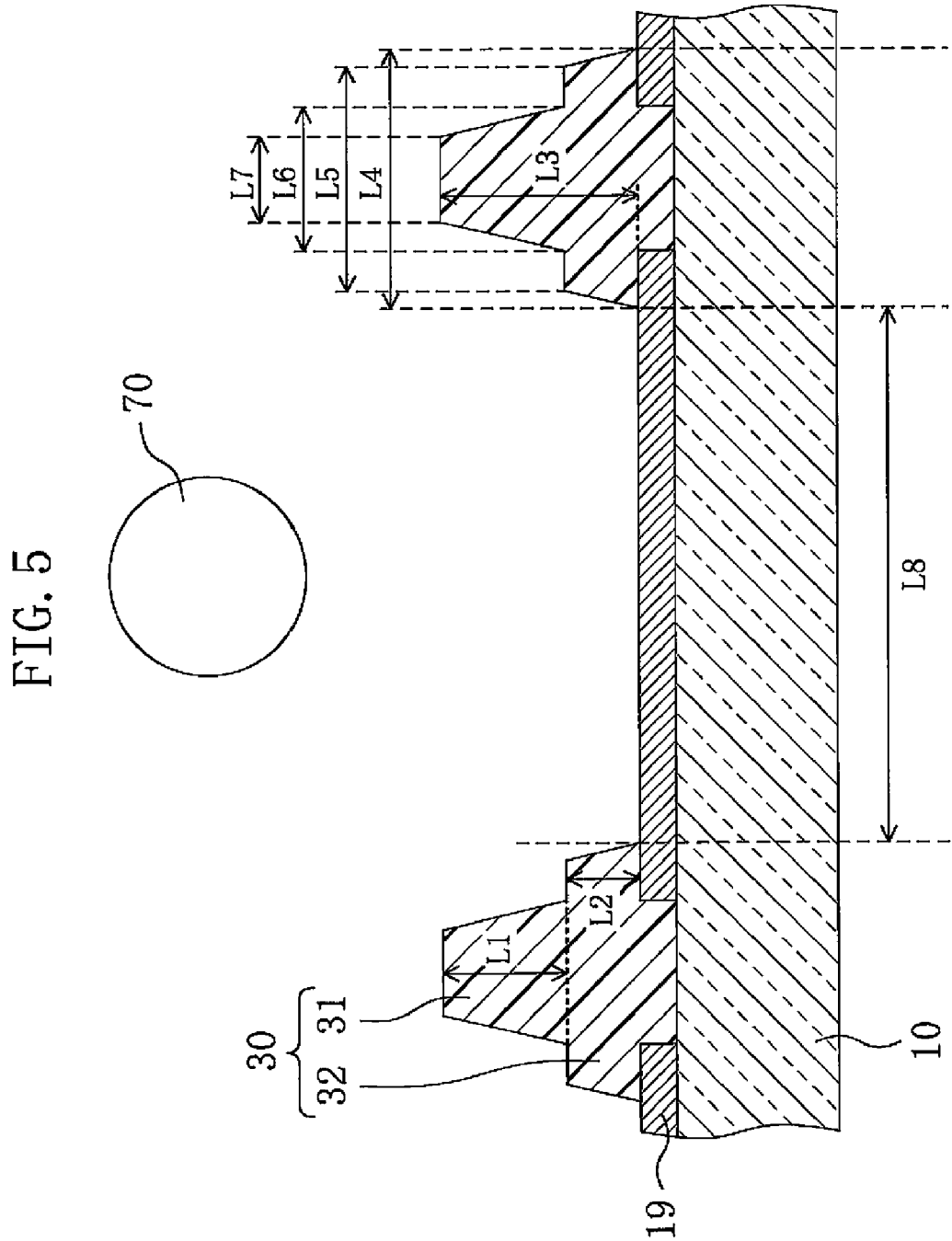
FIG. 5 is a schematic cross-sectional view of an active matrix substrate 10 having a partition 30 thereon.

FIG. 4 is a schematic cross-sectional view for explaining a procedure for forming the hole carrying layer 21 by dropping an ink droplet. It is noted that a shape S1 shown with a broken line in FIG. 4 is a shape of an ink droplet obtained immediately after dropping. As shown in FIG. 4, as the ink droplet is dried, the volume is reduced and the shape is changed from a shape S2 to a shape S3 and from the shape S3 to a shape S4.

As a result of earnest study made by the present inventor, the following has been found: In the case where a sep structure is employed by setting the cross-sectional width of the bottom of the second partition part 31 shorter than the cross-sectional width of the top face of the first partition part 32, an ink droplet is minimally pinned but slips on an inclined face 31a of the second partition part 31 and on a top face 32b of the first partition part 32 and is pinned on an inclined face 32a of the first partition part 32. Also, it has been found that this phenomenon is remarkably exhibited particularly when the pixel electrode 19 has the lyophilic property and the top face 32b of the first partition part 32 has the liquid-repellent property.

Since the pinning of an ink droplet is suppressed on the inclined face 31a in this embodiment, a difference in the thickness of the hole carrying layer 21 between a peripheral portion thereof and a center portion thereof can be reduced. In other words, the hole carrying layer 21 can be formed in a uniform thickness (free from thickness variation). Accordingly, it is possible to realize an organic EL device 1 capable of high quality image display having few brightness spots in the respective pixels.

It is noted that the pinning of an ink droplet on the inclined face 31a can be suppressed regardless of the height L1 of the second partition part 31 and the height L3 of the partition 30 as far as the partition 30 has the step structure. Specifically, for example, even when the height L1 of the second partition part 31 is comparatively large for suppressing flow of a dropped ink droplet onto an adjacent pixel, the pinning of the ink droplet on the inclined face 31a can be suppressed. Accordingly, when this structure is employed, not only the thickness variation of each hole carrying layer 21 can be reduced but also the flow onto an adjacent pixel of an ink subsequently dropped for forming the organic EL luminous layer 22 can be effectively suppressed. Furthermore, since the height L1 of the second partition part 31 can be set comparatively large, the amount of ink to be dropped onto each pixel can be increased. Accordingly, the hole carrying layer 21 can attain a comparatively large thickness. The height of the partition 30 is preferably larger than 1 μm, and more preferably 1.5 μm or more. It is noted that the height L3 of the partition 30 corresponds to a distance to the top of the partition 30 from the pixel electrode 19 directly on which the hole carrying layer 21 is formed as shown in FIG. 4.

The pinning of an ink droplet on the inclined face of the partition 30 cannot be effectively suppressed merely by providing the liquid-repellent property to the partition 30 (without employing the step structure of the partition 30). In this case, it is apprehended that the pinning is caused on the whole inclined face of the partition 30. Accordingly, the organic functional layer 20 is formed to have a thickness comparatively small in a center portion thereof and comparatively large in a peripheral portion thereof.

Next, the organic EL luminous layer 22 is formed on the hole carrying layer 21. As a method for forming the organic EL luminous layer 22, the ink-jet method or the like can be employed similarly to the formation method for the hole carrying layer 21. The organic EL luminous layer 22 is formed by forming a film including a luminous material by the ink-jet method and drying it. The drying is preferably performed by using a hot plate or an oven at 150° C. through 250° C. for 0.5 through 120 minutes. A solvent usable for an ink used for forming the organic EL luminous layer 22 is the same as the solvent usable for the formation of the hole carrying layer 21.

Also with respect to the organic EL luminous layer 22, since the partition 30 has the step structure and has the liquid-repellent property as described above, an ink droplet including a material for the organic EL luminous layer 22 is minimally pinned but slips on the inclined face 31a of the second partition part 31 and the top face 32b of the first partition part 32. Therefore, the organic EL luminous layer 22 can be formed in a uniform thickness with a minimum thickness difference between a center portion thereof and a peripheral portion thereof. Also, as described above, since the height L1 of the second partition part 31 can be set sufficiently high, the organic EL luminous layer 22 can be formed in a large thickness.

Next, the upper common electrode 40 is formed so as to cover the whole of the partition 30 and the organic EL luminous layers 22. As a method for forming the upper common electrode 40, sputtering or deposition can be employed. In order to form the upper common electrode 40 in a uniform thickness without causing disconnection, the height L2 of the first partition part 32 is preferably smaller than 1.5 μm. When the height L2 is not smaller than 1.5 μm, a level difference between the first partition part 32 and the organic EL luminous layer 22 is so large that the upper common electrode 40 may be disconnected in a portion corresponding to the level difference. In order to more effectively suppress the disconnection of the upper common electrode 40, the height L2 of the first partition part 32 is preferably 1 μm or less. It is noted that the height L2 of the first partition part 32 corresponds to a distance to the top of the first partition part 32 from the pixel electrode 19 directly on which the hole carrying layer 21 is formed as shown in FIG. 4.

After forming the upper common electrode 40, the sealing substrate 60 is adhesively fixed with the seal 50, so as to complete the organic EL device 1. A procedure for adhering the sealing substrate 60 onto the active matrix substrate 10 with the seal 50 is preferably performed in an atmosphere of an inert gas such as nitrogen or argon. If it is performed in an atmosphere including oxygen or moisture, the oxygen or moisture remains within the organic EL device 1 and degrades the organic functional layers 20 and the like, and hence, a desired life time cannot be attained. However, when it is performed in an inert gas atmosphere, the invasion of the oxygen or moisture into the organic EL device 1 can be effectively suppressed so as to realize a long product life time.

The materials for the respective members and the fabrication method for the organic EL device 1 mentioned in this embodiment are merely examples and do not limit the invention. Furthermore, although the organic EL device 1 of the active matrix system is described in detail in this embodiment, the organic EL device of this invention may employ a passive matrix system.

Moreover, the functional substrate of this invention is not limited to the aforementioned organic EL device. Specifically, it may be a color filter substrate in which the functional layer corresponds to a color filter layer, a circuit substrate in which the functional layer corresponds to a conducting layer, an organic thin film transistor substrate in which the functional layer corresponds to an organic semiconductor layer or a micro lens substrate in which the functional layer corresponds to a lens layer. As described above, the functional substrate of this invention includes the functional layer with a uniform thickness (free from thickness variation). Accordingly, in the case where, for example, the functional layer is a color filter layer, it is possible to realize a color filter substrate in which the color filter layer has few spots of light transmittance.

EXAMPLES

Example 1

In Example 1, a plurality of kinds of substrates different in the height L1 of a second partition part 31 (the height L3 of a partition 30) were fabricated, and ink droplets 70 including a hole carrying material were dropped onto each of the substrates, so as to observe whether or not the dropped droplets 70 flowed onto adjacent pixel electrodes 19 beyond the partition 30 (namely, whether or not liquid flow occurred). It was determined whether or not the liquid flow occurred by observing each substrate with an optical microscope immediately after dropping the ink droplets 70.

Figure 6:
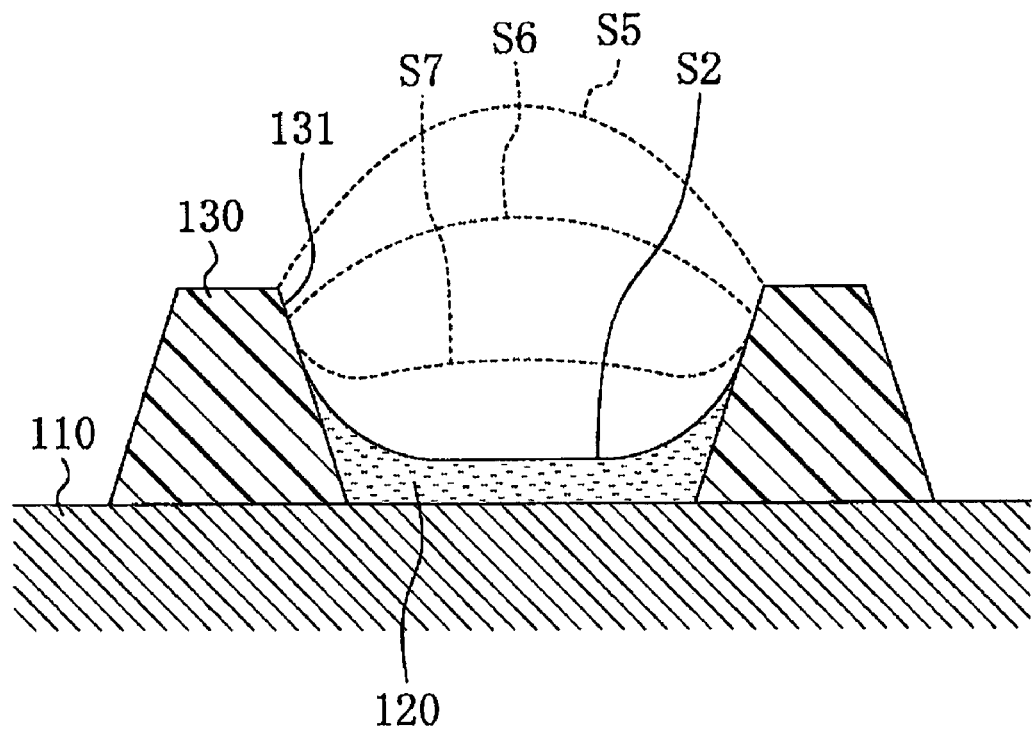
FIG. 6 is a schematic cross-sectional view for explaining a procedure for forming an organic functional layer 120 by the ink-jet method.

An active matrix substrate 10 and the partition 30 had the same structure as those of the organic EL device 1 shown in FIG. 3. FIG. 6 is a schematic cross-sectional view of the active matrix substrate 10 on which the partition 30 is formed. Indium tin oxide (ITO) was deposited on a glass substrate in a thickness of 100 nm by the sputtering. A photoresist was formed on the thus obtained indium tin oxide (ITO) thin film by the spin coating and the exposure was performed for obtaining a desired pattern by using the photomask. After the exposure, the substrate was developed with a developer, and the resultant was cleaned with water, so as to obtain a desired resist pattern. The substrate having the desired resist pattern was dipped in a commercially available iron (III) chloride solution for 5 minutes and the resultant was cleaned with water, and thus, the indium tin oxide (ITO) thin film was etched into a desired shape. Next, the substrate was dipped in a release agent for 5 minutes and cleaned with water so as to peel the photoresist off. Through these procedures, pixel electrodes 19 were fabricated. The partition 30 was formed by applying a polyimide resin material by the spin coating and thereafter performing a photo patterning process including the half exposure and the development. Furthermore, the substrate was subjected to the UV/O3 treatment so as to provide the surfaces of the pixel electrodes 19 with the lyophilic property. The partition 30 was subjected to the liquid-repellent treatment (the CF4 plasma treatment) so as to provide the liquid-repellent property. The height L2 of a first partition part 32 was set to 0.5 μm. The distance L8 between adjacent partitions 30 was set to 50 μm. Each pixel electrode 19 surrounded with the partition 30 was in a substantially square shape with obtuse corners. The width L4 of the bottom and the width L5 of the top face of the first partition part 32 were respectively set to 50 μm and 40 μm. The width L6 of the bottom and the width L7 of the top face of the second partition part 31 were respectively set to 30 μm and 20 μm. Polythiophene and polymer acid were used as the hole carrying material. A solvent in which the hole carrying material was dissolved was pure water. The concentration of the hole carrying material was set to 5%. The total amount of ink droplets dropped per pixel was set to 400 picoliter. The ink droplets 70 were injected from 1 mm above the pixel electrodes 19 at initial velocity of 10 m/s.

The relationship between the height L3 of the partition 30 and the liquid flow is listed in Table 1 below.

TABLE 1

| Height of Partition 30 (L) | Liquid Flow | Evaluation |
| --- | --- | --- |
| 1.0 | The liquid flow was observed in 70 through 80 pixels out of 100 pixels. | x |
| 1.5 | The liquid flow was observed in 3 through 5 pixels out of 100 pixels. | ○ |
| 2.0 | The liquid flow was not observed. | ○ |
| 2.5 | The liquid flow was not observed. | ○ |

As shown in Table 1, in the case where the height L1 of the second partition part 31 was 1 μm (namely, L3=1.5 μm), little liquid flow was observed. Specifically, the liquid flow was observed in 3 through 5 pixels out of 100 pixels. In the case where the height L1 of the second partition part 31 was 1.5 μm or more (namely, L3>2.0 μm), the liquid flow was not observed at all. On the other hand, in the case where the height L1 of the second partition part 31 was 0.5 μm (namely, L3=1 μm), the liquid flow was caused in many ink droplets. Specifically, the liquid flow was observed in 70 through 80 pixels out of 100 pixels. It is understood from these results that when the height L1 of the second partition part 31 is larger than 0.5 μm, namely, when the height L3 of the partition 30 is larger than 1 μm, the liquid flow is minimally caused and hence the hole carrying layer 21 can be suitably formed. Also, it is understood that the height L1 of the second partition part 31 is preferably 1 μm or more and that the height L3 of the partition 30 is preferably 1.5 μm or more.

Example 2

On an active matrix substrate 10 on which a partition 30 was formed, a hole carrying layer 21 and an organic EL luminous layer 22 were formed by the ink-jet method. The partition 30 and the active matrix substrate 10 had the same structure as those of Example 1. The height L1 was set to 0.5 μm, and except for the height L2, the widths L4 through 8 were set in the same manner as in Example 1. Polythiophene and polymer acid were used as a hole carrying material. Polyphenylene vinylene was used as a luminous material. A solvent of an ink used for forming the hole carrying layer 21 and the organic EL luminous layer 22 was xylene. The concentrations of the ink used for forming the hole carrying layer 21 and the organic EL luminous layer 22 were respectively 5% and 10%. After forming the hole carrying layer 21 and the organic EL luminous layer 22 by the ink-jet method, the resultant was dried at 100 through 200° C. for 5 through 30 minutes.

In Example 2, in a plurality of kinds of substrates each having the aforementioned structure and respectively different in the height L2 of a first partition part 32, an upper common electrode 40 was formed by the deposition. The material for the upper common electrode 40 was a multilayered film of an aluminum layer and a calcium layer. The thickness of the upper common electrode 40 was set to 0.1 μm. At this point, the state of the upper common electrode 40 was observed with an optical microscope. The correlation between disconnection of the upper common electrode 40 caused on a level difference portion between the first partition part 32 and the organic EL luminous layer 22 and the height L2 of the first partition part 32 is shown in Table 2 below.

TABLE 2

| Height of First Partition Part 32 | Disconnection | Evaluation |
| --- | --- | --- |
| 0.5 | The disconnection was not observed. | ○ |
| 1.0 | The disconnection was observed in 3 through 5 pixels out of 100 pixels. | ○ |
| 1.5 | The disconnection was observed in approximately a half of pixels. | x |
| 2.0 | The disconnection was observed in almost all the pixels. | x |

As shown in Table 2, in the case where the height L2 of the first partition part 32 was 1.5 μm, the disconnection of the upper common electrode 40 was observed in substantially a half of the pixels. In the case where the height L2 of the first partition part 32 was 2.0 μm, the disconnection of the upper common electrode 40 was observed in almost all the pixels. On the other hand, in the case where the height L2 of the first partition part 32 was 1 μm, the disconnection of the upper common electrode 40 was minimally observed. Specifically, the disconnection of the upper common electrode 40 was observed in merely 3 through 5 pixels out of 100 pixels. In the case where the height L2 of the first partition part 32 was 0.5 μm, the disconnection of the upper common electrode 40 was not observed.

As is understood from the aforementioned results, in the case where the height L2 of the first partition part 32 is smaller than 1.5 μm, the disconnection of the upper common electrode 40 can be effectively suppressed. Also, it is understood that the height L2 of the first partition part 32 is preferably 1 μm or less.

The functional substrate according to this invention is useful for a cellular phone, a PDA, a television, an electronic book, a monitor, an electronic poster, a clock, an electronic tag, an emergency guide and the like.

The invention claimed is:

1. A functional substrate comprising:
a substrate body;
a plurality of functional layers arranged on said substrate body in a given pattern; and
a partition having a surface with a liquid repellent property for partitioning said plurality of functional layers,
wherein said partition includes at least a first partition part with a substantially trapezoidal cross-section provided on said substrate body and a second partition part with a substantially trapezoidal cross-section provided on said first partition part, and a lower base of the cross-section of said second partition part is shorter than an upper base of the cross-section of said first partition part; and
the first partition part and the second partition part are made of the same resin film.

2. The functional substrate of claim 1, wherein said partition includes an organic material.

3. The functional substrate of claim 2, wherein said organic material is one resin or two or more resins selected from the group consisting of a polyimide resin, an acrylic resin and a Novolac resin.

4. The functional substrate of claim 1, wherein each of said plurality of functional layers includes a polymeric organic material.

5. The functional substrate of claim 4, wherein said plurality of functional layers are formed by a wet type application method.

6. The functional substrate of claim 1, wherein said partition has a liquid-repellent property at least on an inclined face thereof and a top face thereof.

7. The functional substrate of claim 1, wherein said partition includes a material having a liquid-repellent property.

8. The functional substrate of claim 1, wherein said partition is formed in a height larger than 1 μm.

9. The functional substrate of claim 1, wherein said partition is formed in such a manner that a height of said first partition part is smaller than 1.5 μm.

10. The functional substrate of claim 1, wherein each of said plurality of functional layers is a color filter layer.

11. The functional substrate of claim 1, wherein each of said plurality of functional layers includes at least an organic electroluminescent luminous layer.

12. The functional substrate of claim 11, wherein each of said plurality of functional layers further includes one or a plurality of buffer layers stacked on said organic electroluminescent luminous layer.

13. The functional substrate of claim 1, wherein each of said plurality of functional layers is a conducting layer.

14. The functional substrate of claim 1, wherein each of said plurality of functional layers is an organic semiconductor layer.

15. The functional substrate of claim 1, wherein each of said plurality of functional layers is a lens layer.

16. A method for fabricating the functional substrate of claim 1, comprising the steps of:
    forming a film on said substrate body; and
    forming said partition by subjecting said film to half exposure.

17. A display panel comprising a functional substrate,
    said functional substrate including a substrate body, a plurality of display medium layers arranged on said substrate body in a given pattern and a partition having a surface with a liquid repellent property for partitioning said plurality of display medium layers,
    wherein said partition includes at least a first partition part with a substantially trapezoidal cross-section provided on said substrate body and a second partition part with a substantially trapezoidal cross-section provided on said first partition part, and a lower base of the cross-section of said second partition part is shorter than an upper base of the cross-section of said first partition part; and
    the first partition part and the second partition part are made of the same resin film.

18. A display device comprising a functional substrate,
    said functional substrate including a substrate body, a plurality of display medium layers arranged on said substrate body in a given pattern and a partition having a surface with a liquid repellent property for partitioning said plurality of display medium layers,
    wherein said partition includes at least a first partition part with a substantially trapezoidal cross-section provided on said substrate body and a second partition part with a substantially trapezoidal cross-section provided on said first partition part, and a lower base of the cross-section of said second partition part is shorter than an upper base of the cross-section of said first partition part; and
    the first partition part and the second partition part are made of the same resin film.

19. A method for fabricating a functional substrate including a substrate body, a plurality of display medium layers arranged on said substrate body in a given pattern and a partition having a surface with a liquid repellent property for partitioning said plurality of display medium layers, said partition including at least a first partition part with a substantially trapezoidal cross-section provided on said substrate body and a second partition part with a substantially trapezoidal cross-section provided on said first partition part, and a lower base of the cross-section of said second partition part being shorter than an upper base of the cross-section of said first partition part, comprising the steps of:
    forming a film on said substrate body; and
    forming said partition by subjecting said film to half exposure.

* * * * *